Figure 3:
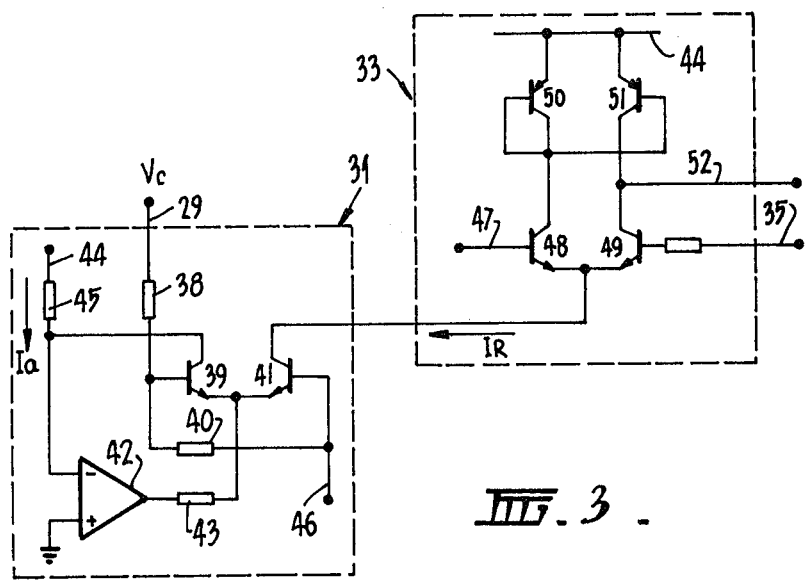

United States Patent [19]

Smith

[11] 4,042,921
[45] Aug. 16, 1977

[54] DIGITAL ENCODER/DECODER

[75] Inventor: Peter Leslie Smith, Northcote, Australia

[73] Assignee: L.M. Ericsson Pty Ltd., Victoria, Australia

[21] Appl. No.: 506,777

[22] Filed: Sept. 17, 1974

Related U.S. Application Data

[63] Continuation-in-part of Ser. No. 423,813, Dec. 11, 1973, abandoned.

[51] Int. Cl.$^2$ ............................................. H03K 13/22
[52] U.S. Cl. ...................... 340/347 AD; 340/347 DA; 325/38 B; 332/11 D
[58] Field of Search ................. 340/347 AD, 347 DA; 325/38 B; 332/11 D

[56] References Cited

U.S. PATENT DOCUMENTS

| | | | |
|---|---|---|---|
| 3,555,423 | 1/1971 | Weston | 325/38 B |
| 3,628,148 | 12/1971 | Brolin | 325/38 B |
| 3,727,005 | 4/1973 | Franaszek | 325/38 B |
| 3,729,678 | 4/1973 | Glasbergen | 325/38 B X |
| 3,781,685 | 12/1973 | Ching | 325/38 B |
| 3,806,806 | 4/1974 | Brolin | 325/38 B |

*Primary Examiner*—Charles D. Miller
*Attorney, Agent, or Firm*—Cushman, Darby & Cushman

[57] ABSTRACT

An average peak slope companded delta codec for converting an analog signal to a corresponding digital signal and vice versa includes a comparator which receives an analog signal and a variable reconstruction signal and converts the analog signal into a digital data bit stream. A detector is provided for detecting the presence of preselected sequences of bits in the digital bit stream. An attack/decay signal is generated wherein the signal increases upon the occurrence of the preselected sequence and decreases upon the non-occurrence of the preselected sequence with the ratio of the increase to decrease of the attack/decay signal being in the range of 30:1 to 500:1. A converter means receives the attack/decay signal and generates a compand signal which is substantially an anti-logarithmic function of the attack/decay signal wherein the rate of increase of the compand signal is in the range of 0.75 dB/bit period to 3.0 dB/bit period. The compand signal is accumulated to form the variable reconstruction signal which is coupled to the input of the comparator. A means is provided for inverting the polarity of the compand signal when the reconstruction signal exceeds the analog input signal so that the reconstruction signal changes in value toward the value of the analog signal during each bit period. An average peak slope companded delta codec for converting a digital signal back to an analog signal is also disclosed.

11 Claims, 9 Drawing Figures

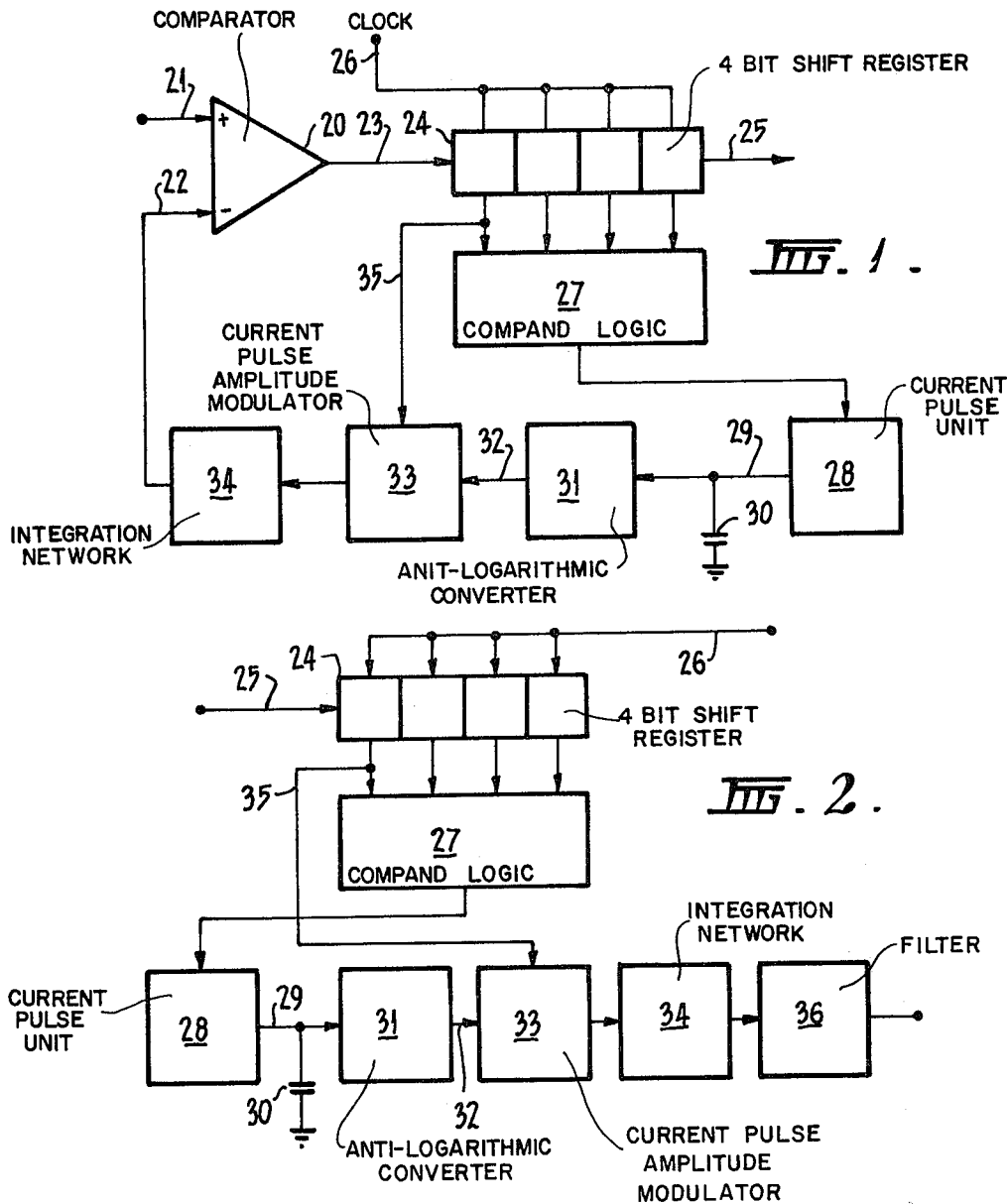

ir = Signal P × Constant Vc

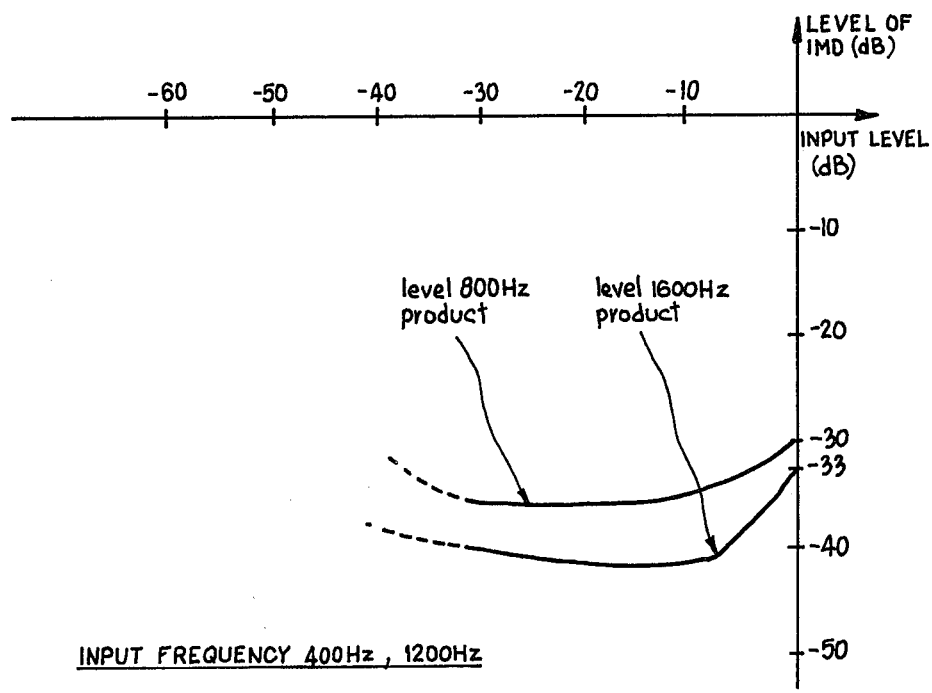
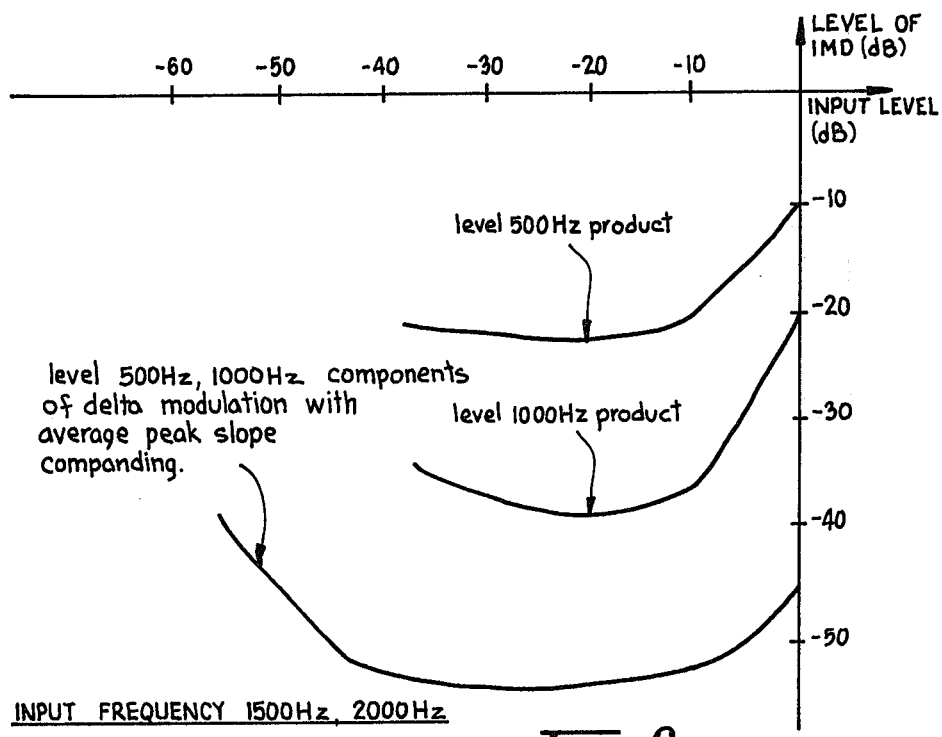
FIG. 6

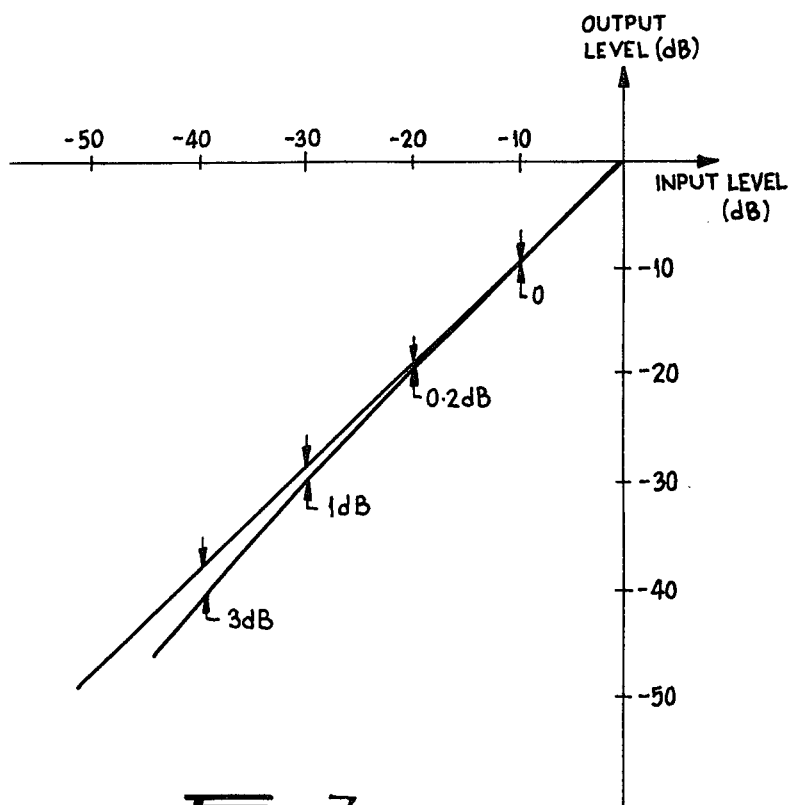
FIG_7
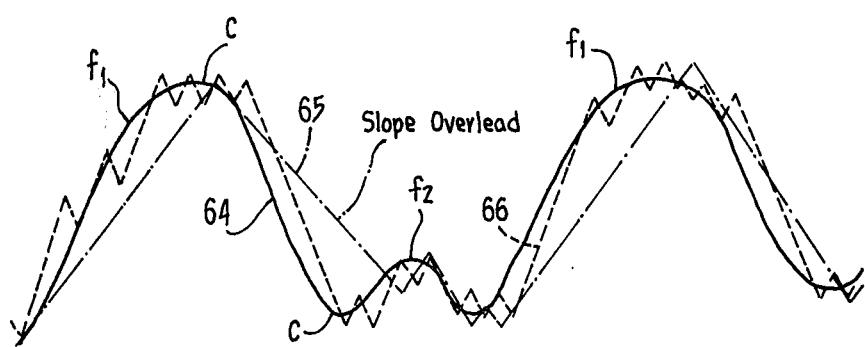
FIG_8

DIGITAL ENCODER/DECODER

BACKGROUND OF THE INVENTION

This application is a continuation-in-part of copending U.S. application Ser. No. 423,813, filed Dec. 11, 1973, now abandoned.

This invention relates to digital pulse communication systems and more particularly to a device for signal conversion between one and the other of a digital bit stream and an amplitude variant analog signal, such as speech. Such a device may be referred to as an analogue/digital (A/D) or digital/analogue (D/A) convertor. A more general term which encompasses A/D and D/A convertors is the term codec.

Generally speaking analogue to digital conversion falls into two important classes, namely:

1. Pule Code Modulation (PCM) wherein the analogue signal is amplitude sampled at a frequency fs, the sample is encoded in an n-bit binary word and data of rate n.fs is generated, and ii. Delta Modulation (DM) wherein the analogue signal is approximated by a series of positive or negative slopes which combine to form a reconstruction signal and each data bit transmitted is the polarity of the reconstruction slope at any instant.

In telephone networks the standard PCM is the CCITT system where the input signal is sampled at 8KHz and an 8 bit word generated according to the A-Law companding. Such a standard ensures good voice transmission performance but PCM codecs are generally more complex and therefore more costly than delta codecs.

Published literature shows many delta modulation systems utilizing companding and such systems are capable of good voice transmission performance but the performance for objective transmission parameters, for example, linearity of gain at different input levels and the level of intermodulation distortion products is below the standard expected of high quality analogue to digital conversion for telephony use as set forth, for example, in the abovementioned CCITT standard.

Figure 5:
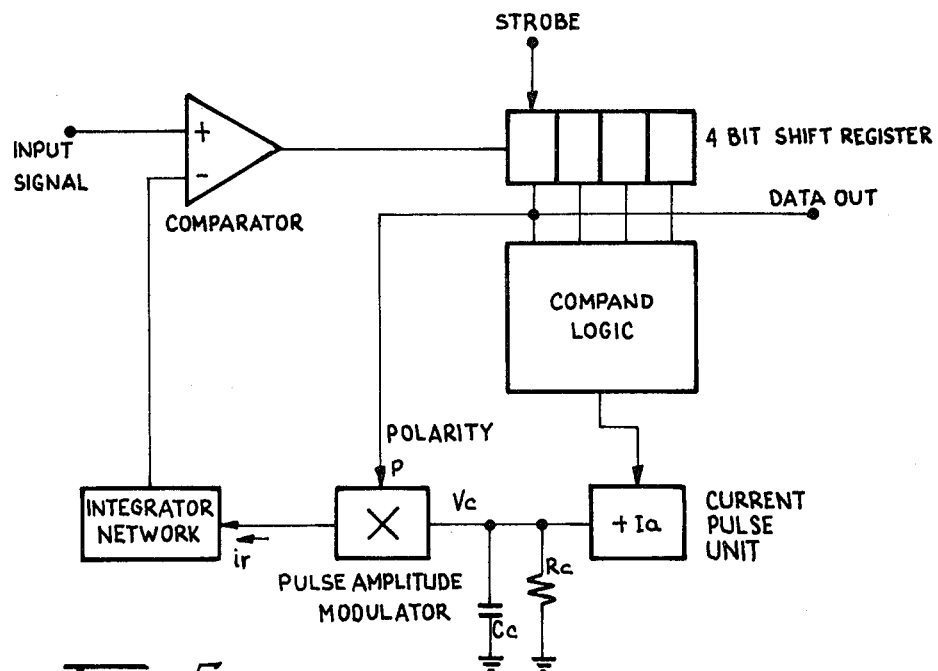

The literature also indicates that for optimum voice performance the companding rates should be syllabic. Syllabic companding tends to adjust the reconstruction step size to the mean slope of the input signal averaged over the syllabic decay time constant. A typical system of this kind is illustrated in FIG. 5 and is similar to a system developed by Phillips and described in an article by K. T. Hanser and S. J. Zarda, "The design of digitally delta modulation codecs" Proc. IREE, July, 1971 P286-14 195. In FIG. 5 the compand logic detects slope overload, that is, the occurrence of four 'ones' or four 'zeros' and on occurrence the current pulse unit delivers a current magnitude of +Ia to the compand control capacitor Cc and thus the reconstruction step size is increased. If four 'ones' or four 'zeros' do not occur, then Vc (the voltage on Cc) is decayed through resistor Rc. The attack and decay rates of this system are such that companding is approximately syllabic.

The prior art system shown in FIG. 5 will only give an acceptable level of intermodulation distortion over a limited range of input levels and only at the lower input frequencies as shown in FIG. 6. The linearity of gain with input level is only acceptable at high input levels as shown in FIG. 7. The voice transmission quality on this typical prior art system shown in FIG. 5 is reasonable with some distortion of transient voice sounds, tht is, sounds such as "ta".

As mentioned above syllabic companding tends to adjust the reconstruction step size to the mean slope of the input signal averaged over the syllabic decay time constant. Thus the compand control (reconstruction step size) simply cannot follow instantaneous high slope regions of the input signal. The operation of this type of companding is shown by reference 65 in FIG. 8. The $f_1 + f_2$ sinosoid type of input signal 64 has instantaneous high slope regions (a) and instantaneous low slope regions (b).

Note:

The signal has in fact regions of zero slope at (C), so the use of "instantaneous" high or low slope is not strictly correct. Instantaneous refers to the slope at zero crossing.

Syllabic companding will adjust to the average step size over many cycles, that is, an integration time much greater than $1/f_1 - f_2$ and so the reconstruction step size set will be less than optimum to track the high slope regions of the signal, and severe slope overload occurs as the companding averages the high and low slope regions of the signal. Thus for a delta modulation system to have a low level of intermodulation distorting the companding must set the reconstruction slope according to the average of the peak or high slopes; hereinafter referred to as "average peak slope." Thus the reconstruction step size will attack in region (a) and decay in region (b) of the signal, that is, adapts to follow the peak slope. It has been determined from experimental results that the important requirement for low intermodulation distortion is that the reconstruction tracks in region (a), because slope overload produces the intermodulation products. Slight over tracking in the region (b) FIG. 8 (caused by a reconstruction signal above optimum) will tend to produce granular noise approximately white in the voice frequency range) but such noise is acceptable because it does not adversely affect the voice transmission performance or the objective transmission parameters discussed above. Thus it is not as important to decay the step size in region (b) as it is to increase step size in region (a).

There are prior delta systems having true instantaneous companding, that is, the companding is set by instantaneous slope and not average peak slope as in the present invention. Thus the step size of such a system does decay in region (c) of FIG. 8 which enables more accurate tracking in the region of high level signals but such systems suffer the disadvantage of poor tracking capabilities each time an input signal having an instantaneous high slope occurs after an input signal having an instantaneous low slope, that is, when a signal such as in region (a) of FIG. 8 occurs immediately after a signal such as in region (b). This poor tracking produces unacceptable intermodulation distortion characteristics. Another problem with such a system is the wide dynamic range required of step size to follow the instantaneous companding law at all times, that is, requiring typically 20dB more range than a syllabic or type of this invention.

The object of this invention is to provide an improved delta modulation codec which is capable of good voice transmission performance and which provides improved objective transmission parameters over the prior art syllabic and instantaneous companded delta modulation systems discussed above.

Figure 9:
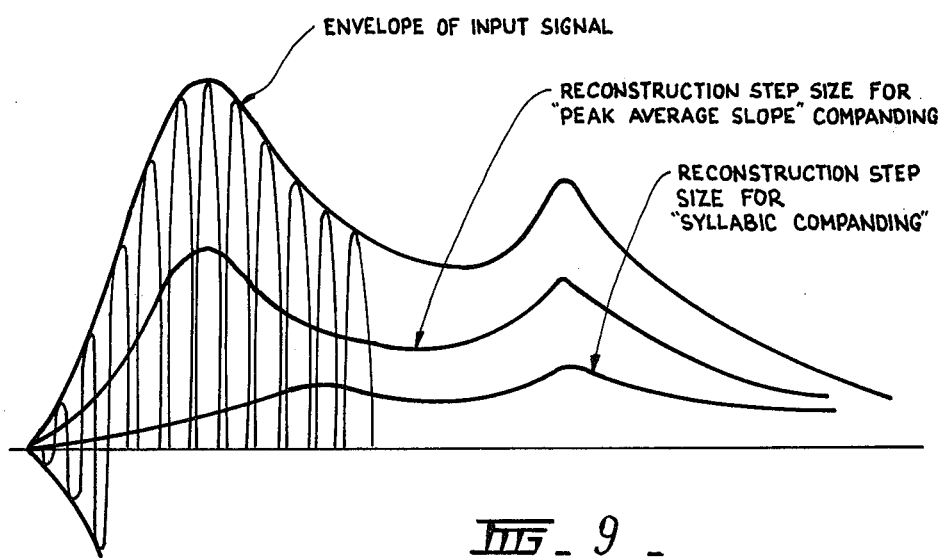

In order to realize the above object the present invention provides companding which tends to adjust step size to the average peak slope over a short time (say $1/f_1 - f_2$ where $f_1$ and $f_2$ are the two different frequencies shown in FIG. 8), and not to the instantaneous slope by any definition. For input signals such as speech with peak level to average level rations of 12 - 15 dB, this type of average peak slope companding allows more accurate encoding of speech sounds with a high transient factor, that is, sounds like ta, pa etc. as shown in FIG. 9 and by reference 66 in FIG. 8.

Throughout this specification the term "average peak slope companding" is used to mean that the companding adjusts to the average of the high slope regions of the input signal as opposed to syllabic or instantaneous companding.

The "average peak slope companding" of the present invention cannot be achieved by simply increasing the attack and decay rates of typical syllablically companded delta modulation systems or reducing the attack rates of typical instanteously companded delta modulation systems. For one thing a defined non-linearity must exist within the encode/decode compand loop to ensure that the "average peak slope companding" occurs and is established over a wide range of analogue input levels. The defined non-linearity establishes a relationship between attack and decay time and input signal level, thus ensuring "average peak slope companding" over a wide dynamic range. For special types of input signal (not necessarily voice frequency) a suitable non-linearity may be chosen to give optimum compand control.

A known system employing a non-linearity in the compand loop is disclosed in U.S. Pat. No. 3,699,566 by Schindler and assigned to the IBM Corporation. Further reference to the Schindler system may be found in an article entitled "Delta Modulation" by H. R. Schindler published in IEEE Spectrum October 1970 p. 76. However, the compand step size of Schindler's system indicates that companding approaches instantaneous companding because of the high attack and decay rates, 2dB and 0.2dB, respectively, per sampling interval. Therefore this system would be expected to suffer the inherent problems of unacceptable intermodulation distortion discussed above.

Without the non-linearity in the compand control loop then attack and decay times would increase proportionally to the input signal level. Thus the companding would be optimum at only one input level. The syllabic system discussed previously has this characteristic. For signal levels above this optimum level the attack/decay times would be too long, so severe slope overload would occur. For signal levels below this optimum the attack/decay times are too short and unstable encoding would occur. Thus the non-linearity chosen in the present invention is preferably logarithmic such that the attack and decay rates are independent of signal level.

Figure 4:
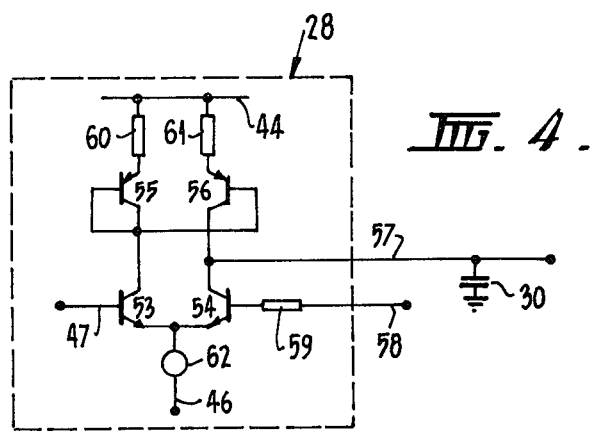

In order that the invention may be more readily understood one particular embodiment will now be described in detail with reference to the accompanying drawing wherein, FIG. 1 is a block diagram of delta encoder according to the embodiment for converting an analogue signal to a digital bit stream, FIG. 2 is a block diagram of a delta decoder according to the embodiment for converting a digital bit stream to an analogue signal, FIG. 3 is a circuit diagram of an anti-logarithmic convertor and a current pulse amplitude modulator of the embodiment of FIG. 1 and 2, FIG. 4 is a circuit diagram of a compand current pulse unit of the embodiment of FIGS. 1 and 2, FIG. 5 is a typical prior art delta encoder, FIG. 6 shows graphs of intermodulation distortion against input signal level for the prior art encoder of FIG. 5, and the lower graph shows a curve representing a level of 500Hz; 1000Hz components of delta modulation with average peak slope companding of the present invention, FIG. 7 shows a graph of linearity of gain against input level of a typical prior art encoder as shown in FIG. 5, FIG. 8 shows a graph comparing syllabic companding with the average peak slope companding of the present invention, and FIG. 9 is a further graph showing the reconstruction step size for syllabic companding and the average peak slope companding of the present invention.

Throught the drawing like reference numerals indicate like or similar parts.

Referring now to FIG. 1 it is seen that the encoder of this embodiment includes a comparator 20 which has two inputs 21 and 22 respectively. An analogue input signal on input 21 is compared with a feedback on input 22 and the comparator provides an output in the form of a high or a digital 'one' when the analogue signal exceeds the feedback signal and a low or digital 'zero' when the feedback signal exceeds the analogue signal. The comparator is clocked at 64KHz and its output 23 is a digital bit stream of 'ones' and 'zeros' depending upon the values of the analogue input and the feed back signal relative to each other.

The output 23 of the comparator 20 is connected to the input of a four bit shift register 24. The output 25 of the shift register is the digital bit stream which is sent to line. Since the data on the output 25 is the same as the data on the input 23, except that it is delayed by four clock periods, it is conceivable that the line connection could be made at the input 23 of the shift register 24. The 64KHz clock signal for the device is provided on connection 26 to the shift register 24.

The shift register 24 has each stage connected to a compand logic unit 27. The compand logic unit 27 comprises a number of gates and detects the occurrence of four 'ones' or four 'zeros' in the shift register 24. The output from the compand logic unit 27 is connected to a current pulse unit 28. During the period when the compand logic unit 27 detects four 'ones' or 'zeros' in the shift register it pulses the current pulse unit 28 to activate the current pulse unit to provide, at its output 29, a constant current of positive polarity during the time it is activated. During the period when the compand logic unit 27 does not detect four 'ones' or four 'zeros' in the shift register 24 the current pulse unit provides, at its output 29, a constant current of negative polarity.

Choice of attack and decay rates determines the type of companding. By choosing both attack and decay rates long the companding is said to be syllabic, that is, the companding average slope and sets step size according to the average slope of a syllable of speech. If both the attack and decay times are short the companding is said to be instantaneous, that is, the companding varies companding step size proportional to the actual instantaneous slope of the input signal. It has been discovered that if the attack times are short and the decay times long then the companding behaves such that the step size is set to average peak slope.

Considerable experiment has been conducted during the development of the invention to find the optimum attack and decay rates. The experiment considered the subjective voice performance and objective performance (such as intermodulation distortion). The optimum attack rate was found to be 0.7dB/clock pulse and attack to decay ratio of 100:1. The optimum is quite broad and reasonable performance is obtained well outside this choice of companding parameters. The attack rate may be reduced to say 0.25dB/clock pulse and increased to 3dB/clock pulse and the attack/decay ratio varied from 30:1 to about 500:1 with some degradation of performance. It is interesting to note that as the attack rate is reduced, that is, the companding tends towards syllabic, the performance degrades and as attack/decay ratio is reduced, that is, the companding is tending toward instantaneous the performance again degrades thus indicating the improvement in performance with average peak slope companding as opposed to the prior art.

As mentioned above the range of attack rate and attack to decay ratio where average peak slope companding is defined is: attack rate in the range 0.25dB/clock pulse to 3dB/clock pulse and attack/decay ratio in the range 30:1 to about 500:1. The system will give good performance over this range and even slightly outside the range but the optimum lies within the range. The actual choice of optimum depends on the signals for which the system is intended. If the system is for voice only then the optimum will be differrent than if the system is for transmission of sinusoidal signals but will still lie in the above range. The optimum (attack rate 0.7dB/clock pulse and 100:1) is the optimum for a system designed to pass speech as well as sinusoidal signals when the clock rate is 64KHz and the detected sequence is four bits long. If other clock rates and sequence lengths in the same order are used then the optimum will still lie in the range but for these other systems there could be some small areas of the range where the system does not provide acceptable results.

In this embodiment positive current from the current pulse unit 28 provides the attack current to cause the reconstruction or feedback signal to increase in value towards the analogue signal and negative current from the unit 28 provides the decay current which reduces the magnitude of the change in the feedback signal when the feedback signal has exceeded the analogue signal, as will be described hereinafter. The positive current from the current pulse unit 28 is in the order of 100 times the negative current in this embodiment but may be trimmed to alter the relationship. During the period when the constant current device is activated the positive output current therefrom charges a compand integration capacitor 30 to cause a linear build up of voltage across the capacitor. The value of the capacitor 30 and the positive polarity current are selected such that during a clock period (15.6 $\mu$s) the voltage build up across the capacitor is about 100mV each time four 'ones' or four 'zeros' occur. As explained above the value of the current may be trimmed and thus the rate of voltage build up may be altered. During a clock period when the constant current device 28 supplies negative polarity current to the capacitor 30 the capacitor is discharged and the voltage decrease across the capacitor 30 is about 1mV.

The voltage across the capacitor 30 is supplied to an anti-logarithmic convertor 31. The anti-logarithmic converter 31 is arranged such that its output 32 is an anti-logarithmic current function of the input voltage as illustrated in equation (3) below. Therefore, for low voltages across the capacitor 30 a change in voltage will cause the output current from the anti-logarithmic converter 31 to change by a lesser amount whereas for higher voltages across the capacitor 30 the same voltage change will produce a much greater current change. It should be apparent that when the rate of occurrence of four 'ones' or 'zeros' in the shift register 24 is high the voltage on the capacitor 30 is high, that is, the compand voltage is high.

The action of the anti-logarithmic converter in the companding feedback loop makes attack rate independent of signal input level. The attack time for a signal to attack from −40dB to −30dB is the same as to attack from −10dB to 0dB; the 0dB point is some arbitrary reference. Thus the attack rate is expressed as dB per time interval. A system which has attack rate (expressed in dB/time interval) constant with input level must have some anti-logarithmic element in the compand feedback circuit. The attack to decay ratio does vary slightly with input level because of the time constant formed by capacitor 30 and resistor 38 plus resistor 40. For a ratio of attack to decay current of 100:1 the attack to decay ratio of the reconstruction signal may be say 70:1 for high input levels and 130:1 for low input levels.

The output 32 from the anti-logarithmic converter is connected to a current pulse amplitude modulator 33. The modulator 33 supplies an output current which is proportional to the voltage signal from the anti-logarithmic convertor 31. The current from the modulator 33 is supplied to an integration network 34 which converts the current signal to a voltage signal to be fed back to the comparator 20 on the connection 22. The voltage on the connection 22 is the reconstruction or feedback voltage which follows the analogue input signal. As previously explained the output of the comparator 20 depends on whether the analogue signal is greater or less than the feedback signal. In addition to the signal from the anti-logarithmic converter 32 the modulator 33 receives a digital signal via connection 35 from the first stage of the shift register 24. The digital signal to the modulator 33 is a polarity connection which establishes the polarity of the step change in the feedback signal to the comparator. For example, if a 'zero' appears on connection 35 immediately after a 'one' has appeared the polarity of the step change in the feedback signal is reversed since the feedback signal has exceeded the analogue input signal. For a 'flat' analogue input to the comparator the bit stream to the shift register 24 would comprise alternative 'ones' and 'zeros' and the polarity of the step change would be reversed for each successive clock period.

The decoder according to this embodiment is shown in FIG. 2 and is essentially the same as the encoder described above with the exception that the comparator 20 is eliminated and a filter 36 is included. The transmitted digital bit stream enters the shift register 24 on input 25 and each bit is successively clocked into the shift register. The remainder of the device is identical to the encoder down to the integration network 34. The voltage signal out of the integration network 34 of the decoder is the same as the feedback signal on the connection 22 of the encoder and is therefore a signal which approximates the original analogue input signal. The filter 36 serves to smooth out the signal from the integration network 34 to provide a signal at its output 37 which closely approximates the original analogue signal. Reference should now be made to FIG. 3 which is a combined circuit diagram of the anti-logarithmic converter 31 and the current pulse amplitude modulator 33. The voltage across the capacitor 30, hereinafter called $V_c$, is applied to the anti-logarithmic converter 31 on connection 29 and is applied via resistor 38 to the base of transistor 39. The base of transistor 39 is coupled via resistor 40 to the base of a further transistor 41. The two resistors 38 and 40 form a voltage divider network. The transistor 39 is supplied with a constant collector current Ia by means of a feedback network including an operational amplifier 42 and a resistor 43. The current Ia is derived from a positive power supply voltage 44 which, in this case is +5V, and is dependent on the value of a series resistor 45 (Ia = 5/$R_{45}$). The base of transistor 41 is connected to a negative power supply voltage 46 which, in this case is −5V.

The operation of the anti-logarithmic converter relies on the collector current ($I_c$) - base emitter voltage ($V_{BE}$) characteristic in the forward biased mode of a transistor illustrated by the following equation (1):

$$I_c = I_o \exp q^V BE/KT \quad (1)$$

where
q = electron charge (Coulombs)
K = Boltzman's constant
T = absolute temperature (.K)
$I_o$ = constant of the transistor The equation illustrates the logarithmic transfer ratio. The emitter voltage of transistor 41 is controlled by the low impedance, temperature compensated emitter of transistor 39, that is, the emitter voltage of the two transistors are controlled by $V_c$ in the ratio;

$$V_{BB} = (R_{40})/(R_{38} + R_{40}) V_c \quad (2)$$

where $R_{40}$ is the ohmic value of resistor 40, $R_{38}$ is the ohmic value of resistor 38, and $V_{BB}$ is the base to base differential between the two transistors. Since $I_c$ of transistor 41 is shown as $I_R$ from the current pulse amplitude modulator 33 then, $$I_R = I_a \exp. ((- q (V_c + 5)/(KT) (R_{40})/(R_{38} + R_{40})) \quad (3)$$

The current $I_R$ is switched in polarity by the current pulse amplitude modulator 33. If the voltage on the polarity connection 35 to the modulator 33 is greater than a reference volage 47 on the base of a transistor 48 then a further transistor 49 is switched on and a current $I_R$ flows from the integration network 34 (FIGS. 1 and 2) into the collector of transistor 49. If the voltage on the polarity connection 35 is less than the reference volage 47 then transistor 49 is OFF and transistor 48 is ON. Thus $I_R$ flows from matched transistors 50 and 51 connected as a current mirror and a current $I_R$ flows from the collector of transistor 51 into the integration network 34 on connection 52.

Reference should now be made to FIG. 4 which shows the circuit diagram of the compand current pulse unit 28. This unit is similar to the modulator 33 and consists essentially of four transistors 53, 54, 55 and 56 connected together as shown. Reference 62 represents a constant current source Ia. The connection 57 is to the anti-logarithmic convertor 31 and capacitor 30 whilst the connection 58 is the connection from the compand logic unit 27 and is applied to the base of transistor 54 via resistor 59. If the voltage on the connection 58 (hereinafter called compand control) is greater than the reference voltage 47 then transistor 54 is ON and a current $I_a$ flows from the capacitor 30 into the collector of transistor 54. If the voltage on the compand control is less than the reference voltage 47 transistor 53 is ON and transistor 5 is OFF. The voltage across resistor 60, call $V_R$ is equal to the produce $I_aR$ where R is the ohmic value of resistor 60. A further resistor 61 connected to the emitter of transistor 56 has a value of dR where d is selected in this case to be 100. The voltage across dR is approximately equal to $I_aR$ and therefore a current of approximately Ia/d flows from the collector of transistor 56 into the capacitor 30. By adjusting the value of resistor 61, that is, by altering d, the relationship between the attack step size and the decay step size may be varied and any ratio within the limits defined above will produce acceptable results although a ratio of 100:1 with an attack rate of 0.7dB/clock pulse provides optimum performance.

The operation of the A/D convertor of FIG. 1 may be understood by considering a sinusoidal input to the comparator 20. Initially, as the sine wave rises there is no feedback signal and the first bit from the comparator is a digital one. The 'one' is sent to the shift register 24 and is gated into the first slot. The digital 'one' in the first slot is transmitted to the modulator 33 by the polarity connection 35. The modulator 33 causes a signal to be fed back to the comparator 20 and the step size of this feedback signal is very low and depends on the value of background noise entering the system prior to the sinusoidal input. During the next clock period the feedback voltage is still far below the analogue signal and thus a further 'one' is sent to the shift register and the original 'one' is shifted into the next slot.

The polarity connection 35 outputs the modulator 33 in the same manner as before and a further feedback signal of the same step size as before is added to the previous signal and fed back to the comparator. The operation continues in this manner and the feedback signal increases approximately linearly until four 'ones' appear in the shift register 24. On detection of four 'ones' the logic unit 27 pulses the current pulse unit to cause a constant current to be fed into the capacitor 30 to thus increase the step size of the signal added to the feedback signal. The feedback signal is thus caused to 'attack' the analogue at a greater rate than before. However, the signal through the antilogarithmic convertor 31 is, as yet, of a low level and therefore the output of the anti-logarithmic convertor is lower than its input. The feedback signal is still less than the analogue signal and during the next clock period a further 'one' bit is sent from the comparator 20 to the shift register 24. The logic circuit again detects four 'ones'in the shift register and pulses the constant current device to further increase the step size of the signal added to the feedback signal. The process continues as each further 'one' goes into the shift register 24. However, the input signal to the anti-logarithmic convertor 31 quickly reaches a value such that the output therefrom exceeds the input. Therefore the rate at which the feedback signal 'attacks' the analogue signal increases rapidly and the feedback signal soon exceeds the analogue signal. On the first pulse after the feedback signal has exceeded the analogue signal the comparator 20 outputs a 'zero' into the shift register 24. The logic unit 27 does not detect four consecutive similar bits and therefore there is no output to the current pulse unit 28. The current pulse unit 28 therefore supplied a —ve polarity current which commences discharging the capacitor 30 and reducing the voltage $V_c$ to the anti-log convertor 31. Also, the polarity connection 35 is now a 'zero' so that the step change of the feedback signal is subtracted from the previous value. The value of the step is less than for the previous clock period due to the lesser charge on the capacitor 30.

The feedback signal will continue to overshoot the analogue signal in opposite directions, but each time by a reduced amount until the minimum step size is reached and overshooting is at a minimum.

FIG. 8 shows the operation of both the average peak slope syllabic companding utilised in this invention as well as the syllabic companding of the prior art for an analogue input signal whose root means square voltage (RMS) is constant but which has larger variations of slope over a single cycle. The syllabic companding shown by reference 65 adjusts step size approximately proportional to the average slope over the syllabic time constant and thus the step is not of sufficient magnitude to track the high slope regions of the signal with low distortion. A system with the average peak slope companding of the above embodiment can change step size within the signal period and therefore can adjust step size to follow the instantaneous high regions with minimum distortion.

It should be appreciated from the above that the present invention provides a considerable improvement over prior art devices. By setting the compand parameters such that the companding controls reconstruction step size to average peak slope the overall performance exceeds that of delta modulation systems with syllabic or instantaneous companding.

According to a modification of the above embodiment the companding may be arranged to detect more or less than four bits of data by altering the number of bits in the shift register 24 and accordingly the compand logic unit 27. Also the anti-logarithmic convetor could comprise a resistive device which is capable of producing a number of linear functions of different slopes which approximate the continuous anti-logarithmic function of the above embodiment. Naturally voltage levels and frequencies may also be varied to suit particular applications of the device. The embodiment described hereinabove has particular utility in a digital PABX telephoen system.

I claim:

1. An average peak slope companded delta codec for converting an analog signal to a digital signal comprising:

comparator means receiving said analog signal and a variable construction signal for converting said analog signal to a digital bit stream, detecting means for detecting the presence of at least one preselected sequence of bits in the digital bit stream, means responsive to said detecting means for generating an attack/decay signal which increase upon the occurrence of said preselected sequence and decreases upon the non-occurrence of said preselected sequence, converter means receiving said attack/decay signal for providing a compand signal which is substantially an anti-logarithmic function of said attack-/decay signal, means for accumulating said compand signal to form said variable reconstruction signal, and polarity inverting means for inverting the polarity of said compand signal when said reconstruction signal exceeds said analog signal, thereby causing said reconstruction signal to change in value toward the value of said analog signal during each bit period, said companding adjusting to the average of the high slope regions of said analog input signal.

2. An average peak slope companded delta codec for converting an analogue signal to a digital signal comprising:

comparator means receiving said analogue signal and a variable reconstruction signal for converting said analogue signal to a digital bit stream, detecting means for detecting the presence of at least one preselected sequence of bits in the digital bit stream, means responsive to said detecting means for generating an attack/decay signal which increases upon the occurrence of said preselected sequence and decreases upon the non-occurrence of said preselected sequence, the ratio of increase to decrease of said attack/decay signal being in the range of 30:1 to 500:1, converter means receiving said attack/decay signal for providing a compand signal which is substantially an anti-logarithmic function of said attack-/decay signal, the rate of increase of said compand signal being in the range of 0.75 dB/bit period to 3.0 dB/bit period, means for accumulating said compand signal to form said variable reconstruction signal, and polarity inverting means for inverting the polarity of said company signal when said reconstruction signal exceeds said analogue signal, thereby causing said reconstruction signal to change in value toward the value of said analogue signal during each bit period, said compand signal being thereby adjusted to the average of the high slope regions of said analogue input signal.

3. The codec of claim 2 wherein said means for generating said attack/decay signal comprises a storage capacitor, and a current pulse generator which generates a current for increasing the voltage across said capacitor upon the detection of said preselected sequence of bits in the digital bit stream and which generates a current for decreasing the voltage across the capacitor in the absence of the detection of said preselected sequence, the ratio of the current for increasing the voltage to the current for decreasing said voltage being in the range of 30:1 to 500:1.

4. The codec of claim 2 wherein said preselected sequences of bits are four "ones" or four "zeros"and wherein said delta codec is timed by means of a clock signal having a frequency of 64 kHz.

5. In an average peak slope companded delta codec the method of converting an analogue signal to a digital signal comprising the steps of:

comparing said analogue signal with a variable reconstruction signal to thereby convert said analogue signal to a digital bit stream having a value in each of the plurality of bit periods depending on the comparison of said analogue signal with said variable construction signal for said period, detecting the presence of at least one preselected sequence of bits in the digital bit stream, generating in response to the detected preselected sequence an attack/decay signal which increases upon the occurrence of said preselected sequence and decreases upon the non-occurrence of said preselected sequence, the ratio of increase to decrease of said attack/decay signal being in the range of 30:1 to 500:1, generating a compand signal in response to said attack/decay signal which is substantially an antilogarithmic function of said attack/decay signal, the rate of increase of said compand signal being in the range of 0.75 dB/bit period to 3.0 dB/bit period, accumulating said compand signal to form said variable reconstruction signal, and selectively inverting the polarity of said compand signal when said reconstruction signal exceeds said analogue signal thereby causing said reconstruction signal to change in value toward the value of said analogue signal during each bit period.

6. The method of claim 5 wherein said attack/decay signal generating step comprises the steps of generating a current for increasing the voltage across a storage capacitor upon the detection of said preselected sequence and generating a current to decrease the voltage across said storage capacitor in the absence of said preselected sequence wherein the ratio of current to increase the voltage to the current for decreasing the voltage being in the range of 30:1 to 500:1.

7. The method of claim 6 wherein said preselected sequence includes the sequence of four "ones" or four "zeros" and further comprising the step of clocking said codec with a frequency of 64 kHz.

8. An average peak slope companded delta codec for converting a digital bit stream to an analogue signal comprising detecting means for detecting the presence of at least one preselected sequence of bits in the digital bit stream, means responsive to said detecting means for generating an attack/decay signal which increases upon the occurrence of said preselected sequence and decreases upon the non-occurrence of said preselected sequence, the ratio of increase to decrease of said attack/decay signal being in the range of 30:1 to 500:1, converter means receiving said attack/decay signal for providing a compand signal which is substantially an anti-logarithmic function of said attack/decay signal, the rate of increase of said compand signal being in the range of 0.75 dB/bit period to 3.0 dB/bit period, means for accumulating said compand signal to form a reconstruction signal, means for inverting the polarity of said compand signal upon the change of value of an input bit in said digital bit stream to thereby change the value of said reconstruction signal, and means for filtering said reconstruction signal to thereby provide an analogue signal corresponding to said digital bit stream.

9. The codec of claim 8 wherein said means for generating said attack/decay signal comprises a storage capacitor, and a current pulse generator for generating a current for increasing the voltage on said capacitor upon the detection of said preselected sequences and for generating a current for decreasing the voltage on said capacitor in the absence of said preselected sequence, the ratio of the current for increasing the voltage across said capacitor to the current for decreasing the voltage thereacross being in the range of 30:1 to 500:1.

10. The codec of claim 8 wherein the preselected sequence of bits includes four "ones" or four "zeros" and wherein said codec is operated from a clerk frequency of 64 kHz.

11. In an average peak slope companded delta codec a method of converting a digital bit stream to an analogue signal comprising the steps of:

detecting the presence of at least one preselected sequence of bits in said digital bit stream, generating in response to the detected preselected sequence an attack/decay signal which increases upon the occurrence of said preselected sequence and decreases upon the non-occurrence of said preselected sequence, the ratio of increase to decrease of said attack/decay signal being in the range of 30:1 to 500:1, generating a compand signal in response to said attack/decay signal which is substantially an antilogarithmic function of said attack/decay signal, the rate of increase of said compand signal being in the range of 0.75 dB/bit period to 3.0 dB/bit period, accumulating said compand signal to form a variable reconstruction signal, selectively reversing the polarity of said compand signal when an input bit of said digital bit stream changes its state to thereby vary the amplitude of said reconstruction signal, and means for filtering said reconstruction signal to provide an analogue signal which varies in accordance with the information in said digital bit stream.

* * * * *